(12) United States Patent
Bonart et al.

(10) Patent No.: US 10,134,697 B2
(45) Date of Patent: Nov. 20, 2018

(54) SEMICONDUCTOR CHIP AND METHOD OF PROCESSING A SEMICONDUCTOR CHIP

(71) Applicant: Infineon Technologies AG, Neubiberg (DE)

(72) Inventors: Dietrich Bonart, Bad Abbach (DE); Ludger Borucki, Munich (DE); Martina Debie, Bogen (DE); Bernhard Weidgans, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/995,028

(22) Filed: Jan. 13, 2016

(65) Prior Publication Data

US 2016/0204075 A1 Jul. 14, 2016

(30) Foreign Application Priority Data

Jan. 14, 2015 (DE) .................. 10 2015 100 521

(51) Int. Cl.
*H01L 23/00* (2006.01)

(52) U.S. Cl.
CPC .............. *H01L 24/05* (2013.01); *H01L 24/03* (2013.01); *H01L 24/06* (2013.01); *H01L 24/13* (2013.01); *H01L 24/29* (2013.01); *H01L 24/33* (2013.01); *H01L 24/83* (2013.01); *H01L 2224/0345* (2013.01); *H01L 2224/03614* (2013.01); *H01L 2224/03901* (2013.01); *H01L 2224/0401* (2013.01); *H01L 2224/04026* (2013.01); *H01L 2224/05083* (2013.01); *H01L 2224/05139* (2013.01); *H01L 2224/05144* (2013.01); *H01L 2224/05147* (2013.01);

(Continued)

(58) Field of Classification Search
None
See application file for complete search history.

(56) References Cited

U.S. PATENT DOCUMENTS

| 6,448,171 B1 | 9/2002 | Wang et al. |
| 8,350,378 B2 | 1/2013 | Spitz et al. |

(Continued)

FOREIGN PATENT DOCUMENTS

| CN | 1700460 A | 11/2005 |
| DE | 102006044691 A1 | 3/2008 |

(Continued)

OTHER PUBLICATIONS

English Language Abstract of US2005258539 A1, corresponding document of CN 1700460 A.

*Primary Examiner* — Khaja Ahmad (57) ABSTRACT

Various embodiments provide a semiconductor chip, wherein the semiconductor chip comprises a first contact area and a second contact area both formed at a frontside of the semiconductor chip; a passivation layer arranged at the frontside between the first contact area and the second contact area; and a contact stack formed over the frontside of the semiconductor chip and comprising a plurality of layers, wherein at least one layer of the plurality of layers is removed from the passivation layer and boundary regions of the contact areas being adjacent to the passivation layer and wherein at least one another layer of the plurality of different layer is present in the boundary region of the contact areas adjoining the passivation layer.

11 Claims, 5 Drawing Sheets

(52) U.S. Cl.
CPC ............... *H01L 2224/05155* (2013.01); *H01L 2224/05166* (2013.01); *H01L 2224/05172* (2013.01); *H01L 2224/05184* (2013.01); *H01L 2224/05187* (2013.01); *H01L 2224/05564* (2013.01); *H01L 2224/05582* (2013.01); *H01L 2224/05639* (2013.01); *H01L 2224/05644* (2013.01); *H01L 2224/0603* (2013.01); *H01L 2224/13026* (2013.01); *H01L 2224/26145* (2013.01); *H01L 2224/291* (2013.01); *H01L 2224/33181* (2013.01); *H01L 2224/8384* (2013.01); *H01L 2224/83447* (2013.01); *H01L 2224/83815* (2013.01); *H01L 2924/1203* (2013.01); *H01L 2924/1306* (2013.01); *H01L 2924/3841* (2013.01)

(56) References Cited

U.S. PATENT DOCUMENTS

| | | | | |
|---|---|---|---|---|
| 2002/0180064 | A1* | 12/2002 | Hwan | ................ H01L 23/29 257/780 |
| 2007/0246826 | A1* | 10/2007 | Chung | ............... H01L 23/3114 257/734 |
| 2011/0254161 | A1* | 10/2011 | Hu | .......................... H01L 24/05 257/738 |
| 2013/0127045 | A1* | 5/2013 | Lin | ....................... H01L 21/568 257/737 |

FOREIGN PATENT DOCUMENTS

| | | |
|---|---|---|
| EP | 0720234 A2 | 7/1996 |
| EP | 1353377 A2 | 10/2003 |
| TW | 498510 B | 8/2002 |

\* cited by examiner

SEMICONDUCTOR CHIP AND METHOD OF PROCESSING A SEMICONDUCTOR CHIP

TECHNICAL FIELD

Various embodiments relate to a semiconductor chip, in particular a switching element, and a method of processing a semiconductor chip.

BACKGROUND

In the field of semiconductor devices or manufacturing semiconductor components, e.g. so called press-fit power diodes, it is known to use solder layers to electrically connect a semiconductor chip or die.

For example, from U.S. Pat. No. 8,350,378 B2 A diode, e.g., a press-fit power diode for a rectifier in a motor vehicle, is known which includes a semiconductor chip which is connected to a head wire and a base via solder layers. A plastic sheathing, which is situated at least in the chip area and includes a plastic sleeve, enables a hard casting compound to be used and establishes a mechanical connection between the base and the head wire and forms a housing together with the base. An undercut, which extends into the casting compound, and a gap between the sleeve and the edge of the base achieve a compact design. Bevels provided on both sides enable the diode to be pressed into the rectifier from two sides.

SUMMARY

Various embodiments provide a semiconductor chip, wherein the semiconductor chip comprises a first contact area and a second contact area both formed at a frontside of the semiconductor chip; a passivation layer arranged at the frontside between the first contact area and the second contact area; and a contact stack formed at the frontside of the semiconductor chip and comprising a plurality of layers, wherein at least one layer of the plurality of layers is removed from the passivation layer and boundary regions of the contact areas being adjacent to the passivation layer; and wherein at least one another layer of the plurality of different layer is present in the boundary region of the contact areas adjoining the passivation layer.

Furthermore, various embodiments provide a semiconductor chip, wherein the semiconductor chip comprises a contact area formed at a frontside of the semiconductor chip, wherein a passivation layer is arranged at the frontside adjoining the contact area in a boundary region of the contact area; and a multilayer metallization stack comprising a first layer and a second layer, wherein the first layer is formed above at least portions of the contact area, the boundary region and portions of the passivation layer and the second layer is formed only above portions of the contact area.

Moreover, various embodiments provide a method of processing a semiconductor chip, wherein the method comprises providing a raw semiconductor chip comprising a frontside at which at least two contact areas are formed, wherein a passivation layer is arranged between the at least two contact areas; forming a first layer of a contact stack on the frontside of the raw semiconductor chip; forming a second layer of a contact stack on the first layer; and removing portions of the second layer above the passivation layer and portions of at least one of the contact areas.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which.

DETAILED DESCRIPTION

In the following further exemplary embodiments of a semiconductor chip, and a method of processing a semiconductor chip are described. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a semiconductor chip comprising at least one contact area and an (laterally) adjoining passivation layer both formed at the frontside of the semiconductor chip, wherein at the frontside of the semiconductor chip a multilayer contact stack is formed and subsequently at least one layer of the multilayer contact stack is removed over the passivation layer and at least portions of the at least one contact area. The portions at which the at least one layer is removed over the contact area may form boundary regions or intermediate portions and may be directly adjacent to the passivation layer. In particular, at least one other layer of the multilayer contact stack still remains at or over the boundary region and a portion of the passivation layer.

In particular, the contact stack may be a multilayer contact stack. It should be noted that the passivation layer may be formed around all sides of the contact areas, e.g. at the edge portions or regions of the semiconductor chip as well and not only between contact areas. For example, the edge portion of a used semiconductor substrate may itself represent a passivation layer or an additional passivation layer may be formed at the edge portions of the substrate. In particular, the portion of the contact area at which at least one layer of the plurality of different layers is removed may form an intermediate portion. Thus, the term "boundary region" or "intermediate portion" may particularly denote a region of the frontside of the semiconductor chip forming the region in which a respective one of the contact areas directly abuts the passivation layer and the at least one layer is removed. Preferably the at least one layer (e.g. second layer) is removed totally from the passivation layer. In particular, the contact area and the passivation layer may be arranged laterally side by side on the frontside of the semiconductor chip.

In particular, (while at least one layer of the plurality of different layers is removed) at least one layer (e.g. a first layer) of the plurality of different layers is still present in the boundary region and at least partially over the passivation layer. That is, it may be said that the multilayer contact stack is formed of at least two regions or portions wherein at a first portion (e.g. the one formed by a central portion of the contact area(s)) comprises the plurality of different layer, while at a second portion (e.g. the one formed by the intermediate portion or boundary region and parts of the passivation layer) may comprise a reduced number of layers which is at least one smaller than the plurality of different layers, in particular only a single layer. That is, at the central region of the contact area the contact stack may comprise additional layers which are removed, e.g. etched back, by a pull-back process in the boundary region and the passivation layer. In particular, the contact stack may form a metallization or metallization layer.

By providing a semiconductor chip comprising a multi-layer contact stack or metallization having a reduced number of layers over a passivation layer of the frontside of a semiconductor chip it may be possible to provide a semiconductor chip exhibiting a flatter topology on the frontside of the semiconductor chip. This may in particular be true compared to typical semiconductor chips, e.g. power diodes or power transistors, having formed the full multilayer contact stack or metallization over at least portions of the passivation layer (which typically extends in height over the contact areas). Such a flatter topology may as well reduce mechanical stress at edge portions of the chip due to reduced forces induced at such edges, which may result in an improved performance over a great number of thermocycles.

It should be noted that preferably not all layers of the metallization are removed from the boundary regions of the contact area and the passivation layer. Thus, at least one layer of the multilayer metallization remains in the boundary region of the contact area and (partially) over the passivation layer. Depending on the material of this remaining layer this layer may serve as a stop layer (e.g. for etching) and/or an auxiliary layer during a soldering process, e.g. avoiding excessive flow of a solder in case the material of the remaining layer is non-wettable or has at least a low wettability.

In particular, the second layer may not be present over or on the passivation layer. For example, the first layer may be an adhesion promoter layer, comprising or consisting of titanium (which may be oxidized during a further processing), tungsten or the like. The first layer may have a thickness of between 100 nm and 500 nm, e.g. 200 nm. The second layer may be a contact or metallization layer and may comprise or consist of nickel, copper or a compound comprising nickel, e.g. a nickel vanadium compound. The second layer may have a thickness of between 200 nm and 400 nm, e.g. 300 nm. In addition, optional further layers may be present during the processing or at the finished or completed semiconductor chip. For example a protection layer comprising silver and/or gold may be formed initially above the second (e.g. contact layer), which serves as a protection for the contact layer, e.g. before a contact wire or the like is connected (soldered or sintered, for example) to the contact area via the contact layer. The protection layer may have a thickness of between 100 nm and 1000 nm, e.g. 300 nm.

The partial removing of at least one layer of the contact stack at the region of the passivation layer may result in a lower topology of the raw semiconductor chip including the contact stack or metallization used for contacting the contact areas.

In the following exemplary embodiments of the semiconductor chip are described. However, the features and elements described with respect to these embodiments can be combined with exemplary embodiments of the methods of processing a semiconductor chip.

According to an exemplary embodiment of the semiconductor chip at least one (another) layer of the plurality of different layer is present in a boundary region of the passivation layer adjoining the contact areas.

According to an exemplary embodiment of the semiconductor chip the plurality of different layers is formed by at least three layers each comprising a different metallic material.

In particular, the layers may comprise or may consist of a metallic material or a compound comprising a metallic material and nitrogen and/or oxygen.

According to an exemplary embodiment of the semiconductor chip at least one layer of the plurality of layers comprises one element selected out of the group consisting of: titanium, tungsten, titanium nitride, nickel, vanadium, copper, silver, gold, and a compound thereof.

In particular, a layer which is not removed in the boundary region of the contact area and the passivation layer may comprise titanium (or titanium oxide formed therefrom during the manufacturing process), tungsten, and titanium nitride which may be advantageous since these elements or compounds may be suitable as etch stop layers and/or may be non-wettable for typical solder materials. Thus, the layer remaining in the boundary region(s) may be used as well as an etch stop and for avoiding that solder may be deposited or flow into the boundary region(s). Therefore, it may be possible that due to the non-wettability (or at least reduced wettability) the chances or danger of shorts between different contact areas and/or passivation layers may be reduced or even avoided.

According to an exemplary embodiment of the semiconductor chip the contact stack comprises an adhesion promoter layer, a contact layer and a protection layer wherein the contact layer is arranged between the adhesion promoter layer and the protection layer.

The adhesion promoter layer may particular comprise titanium. The protection layer may particularly comprise silver and/or gold, for example. The contact layer, e.g. a layer which can contacted via soldering or sintering, may particularly comprise nickel and/or vanadium or an alloy thereof.

According to an exemplary embodiment of the semiconductor chip the first contact area may form a gate contact and the second contact area may form a source contact.

According to an exemplary embodiment of the semiconductor chip the semiconductor chip forms one element out of the group consisting of transistor; and diode.

In particular, the semiconductor chip may form a power diode, e.g. a press-fit diode or transistor.

According to an exemplary embodiment of the semiconductor chip the second layer is removed at least above the passivation layer.

In particular, the second layer may be removed above or from the passivation layer and (at least portions) of the boundary region of the contact area. Thus, the first layer may be at least partially exposed in the boundary region of the contact areas and/or of the passivation layer. Due to this exposure the first layer may act as a barrier for solder during a later soldering process in case the remaining and exposed first layer is non-wettable.

According to an exemplary embodiment the semiconductor chip further comprises a second contact area arranged such that the passivation layer is arranged (laterally) between the contact area and the second contact area.

The contact areas may form contact terminals, e.g. a gate terminal or contact and a source terminal or contact, in case the semiconductor chip forms a diode. Of course more than two contact areas may be formed, e.g. in case the semiconductor chip forms a transistor.

In the following exemplary embodiments of the method of processing a semiconductor chip are described. However, the features and elements described with respect to these embodiments can be combined with exemplary embodiments of the semiconductor chip.

According to an exemplary embodiment the method further comprises forming a third layer of the contact stack on the second layer, before removing portions of the second layer.

In particular, the plurality of layers of the contact stack or metallization may be deposited via a sputtering and/or evaporation process possibly leading to very uniform and smooth layers.

According to an exemplary embodiment of the method the removing of portions of the second layer is performed by an etching process.

In particular, an etching mask may be formed on the contact stack (e.g. the second or third layer) defining the areas which shall be removed. For example, a photoresist may be deposited on the contact stack which photoresist is subsequently structured in such a way that portions or regions of the photoresist arranged over portions or regions of the contact stack which shall remain on the contact areas remain while portions above the boundary region(s) of the contact areas and the passivation layer are removed. Alternatively, the second layer may be removed by a lift-off or polishing process, or alike. It should be mentioned that the whole structuring (of the first, second and third layers) may be performed by etching, lift-off or polishing processes or any other suitable structuring process.

According to an exemplary embodiment the method further comprises contacting the contact stack by a process selected out of the group of sintering and soldering.

Depending on the material used for the first layer of the contact stack, the exposed portions of the first layer may act as solder barrier. In particular, in case titanium is used as material for the first layer (e.g. adhesion promoter layer) titanium oxide may be formed during a removing (e.g. etching) process which is non-wettable or possesses only a low wettability for typical solder materials. Thus, it may not be necessary to use a solder resist mask or the like to prevent solder creeping or overflow, which cannot be used in each topologies, e.g. due to the additional height induced by such additional solder resist masks.

According to an exemplary embodiment of the method the first layer comprises titanium and the second layer comprises nickel and vanadium.

An optional third or protection layer may comprise silver or gold, for example. By using such a third layer or protection layer the solderable second layer may not be endangered by residues or oxidation during the following processing.

In the following specific embodiments of the semiconductor chip, the semiconductor chip arrangement and the methods of processing a semiconductor chip will be described in more detail with respect to the figures.

Figure 1:
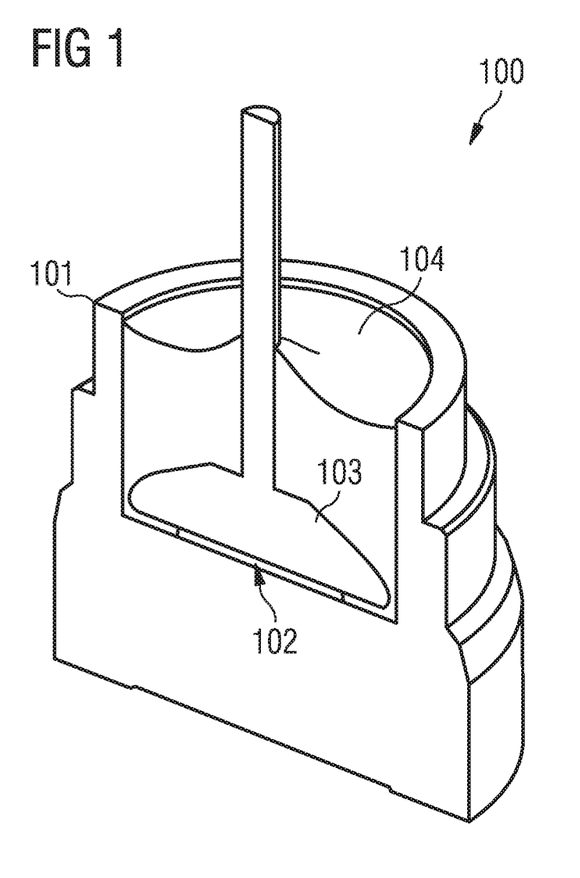
FIG. 1 schematically illustrates a cross sectional view of a semiconductor arrangement.

FIG. 1 schematically illustrates a cross sectional view of a semiconductor arrangement 100 comprising a sheathing or housing 101, preferably made of a metal like copper, and a semiconductor chip 102, e.g. a switching element like a power diode or transistor. The semiconductor chip 102 is connected and contacted at both sides to a base of the sheathing 101 and to a head wire 103, respectively. The head wire 103 may be made of copper as well. The connection or bonding may be via a soldering or via a sintered layer, for example. In addition, a molding compound 104 is shown encapsulating the semiconductor chip 102.

Figure 2A:
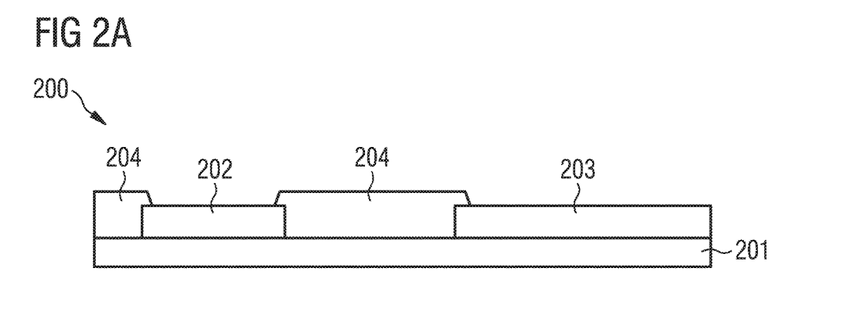
FIGS. 2A to 2F schematically illustrate a process flow of processing a semiconductor chip.

FIGS. 2A to 2F schematically illustrate a process flow of processing a raw semiconductor chip 200. In particular, FIG. 2A shows a cross sectional view of a raw semiconductor chip 200 comprising a semiconductor die 201 having formed thereon contact areas or metallization pads 202 and 203, forming a gate pad 202 and a source pad 203. Laterally between the two contact areas 202 and 203 a passivation layer 204 comprising HSP and/or imide for example. The passivation layer 204 may be formed by depositing the respective material over the total frontside of the semiconductor chip and structuring the same to expose the metallization pads again.

Figure 2B:
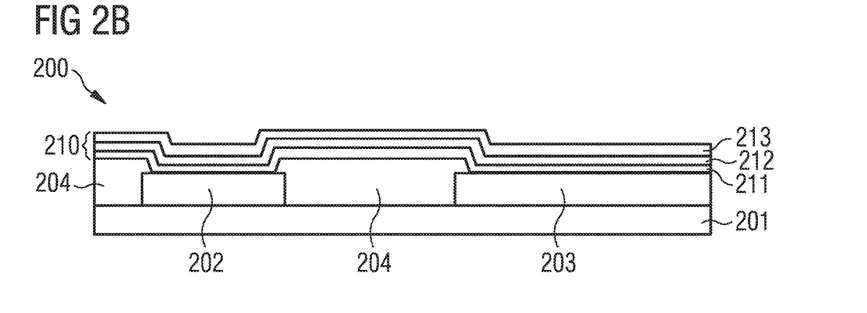

FIG. 2B schematically illustrate the semiconductor chip of FIG. 2A after a plurality of layers of a contact stack 210 or metallization is formed thereon. In particular, a first layer 211 is formed and functions as an adhesion promoting layer. Possible materials for the first layer may be titanium and/or tungsten and/or titanium nitride. A second layer 212 functioning as a contact layer (which can be contacted or bonded via a soldering or sintering process) is formed on the first layer 211 and may comprise nickel, vanadium, copper or an alloy thereof, e.g. nickel vanadium. A third layer 213 functioning as a protection layer is formed on the second layer 212 and may comprise silver and/or gold, for example. Examples, of the thicknesses of the three layers may be about 200 nm for the first, about 300 nm for the second, and 300 nm for the third layer. However, it should be noted that the thicknesses of course may be adapted depending on the needs.

Figure 2C:
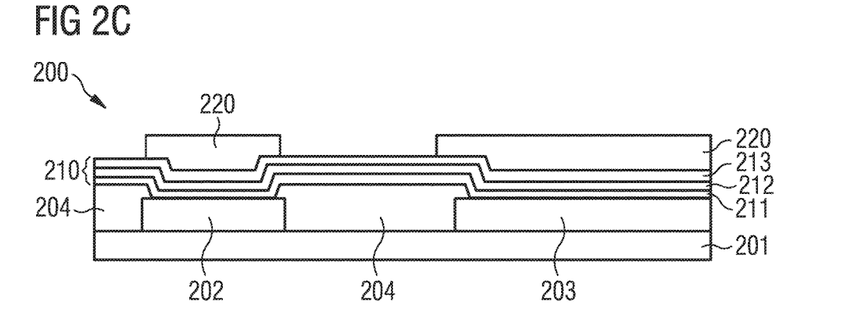

FIG. 2C schematically illustrate the semiconductor chip of FIG. 2B after a photo resist 220 is coated and structured. In particular, the photo resists is structured that it covers the contact areas or metallization pads 202 and 203.

Figure 2D:
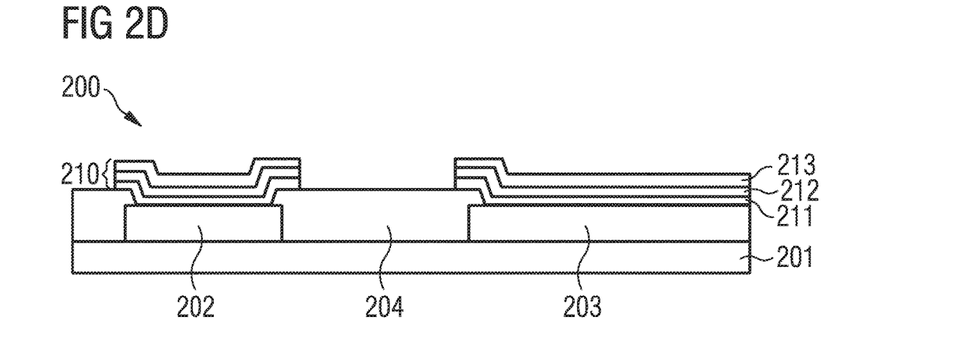

FIG. 2D schematically illustrate the semiconductor chip of FIG. 2C after a removal process in which the contact stack 210 is completely removed above the areas not covered by the structured photoresist 220, e.g. via a (wet-chemical) etching process. In addition, the photo resist 220 is removed.

In principle the semiconductor chip shown in FIG. 2D could be used to be implemented in a semiconductor arrangement as depicted in FIG. 1. However, as can be seen in FIG. 2D the semiconductor chip has a relative uneven topology and is significantly higher at boundary portions of the passivation layer 204 in which the contact stack is not removed. In addition no element like imide or photo resist will hinder solder to spread over the whole metallization or contact stack. Thus, in additional steps some layers of the contact stack 210 are removed in further areas or portions of the frontside of the semiconductor chip 200, which is shown in the following figures.

Figure 2E:
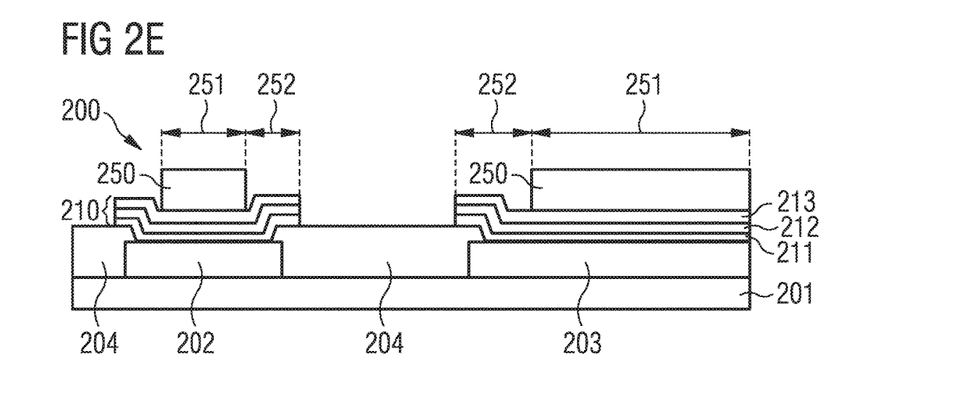

FIG. 2E schematically illustrate the semiconductor chip of FIG. 2D after forming and structuring a further resist mask 250 on the surface of the contact stack. This further resist mask only covers a central part or portion 251 of the contact pads 202 and 203, while boundary portions or regions 252 of the passivation layer and the contact areas are uncovered.

Figure 2F:
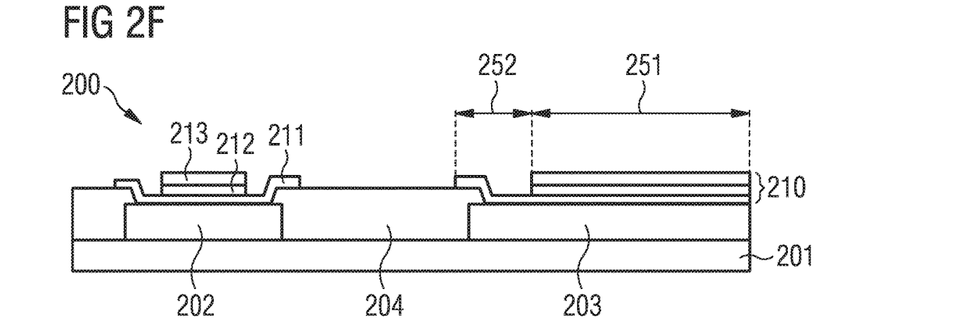

FIG. 2F schematically illustrate the semiconductor chip of FIG. 2D after a removal process in which the second layer 212 and third layer 213 of the contact stack 210 are removed or pulled back in further regions at the areas not covered by the structured resist 250 (i.e. the boundary regions of the passivation layers and the contact areas), e.g. via a (wet-chemical) etching process. However, the first layer remains in the uncovered portions (boundary regions) of the passivation layer and the boundary region of the contact areas 202 and 203. It should be noted that (as indicated in FIG. 2F) the width of the boundary regions (or the degree of bull back of the contact stack) may be different in different areas of the frontside of the semiconductor chip. For example, the width of the boundary regions of the contact areas may be in the range of 10 micrometer to 300 micrometer, e.g. about 50 micrometer.

Due to the use of titanium in the adhesion promotion layer 211 (which may be oxidized subsequently on air or during an etching process depending on the etching process) the uncovered first layer remaining on portions of the boundary regions 252 of the passivation layer and the contact area a subsequent soldering process may be simplified. In particular, such a titanium(oxide) layer has a low degree of wettability or is even non-wettable. Thus, spreading or flowing of solder during a soldering process may be avoided reducing the probability of shorts between different contacts (e.g. gate and source) or in case of chip edge between front- and backside.

Figure 3A:
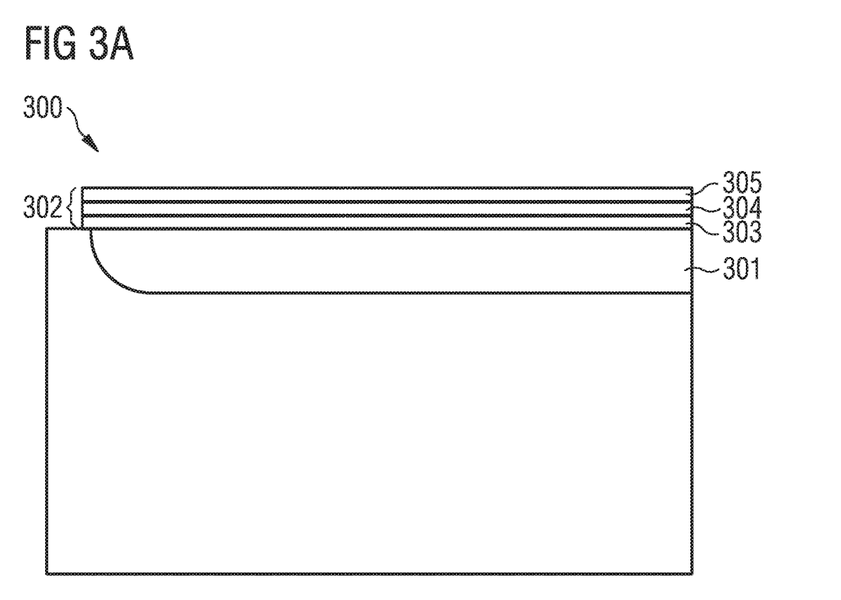
FIGS. 3A and 3B show a comparison of semiconductor chips processed according to prior art and according to an exemplary embodiment, respectively.
Figure 3B:
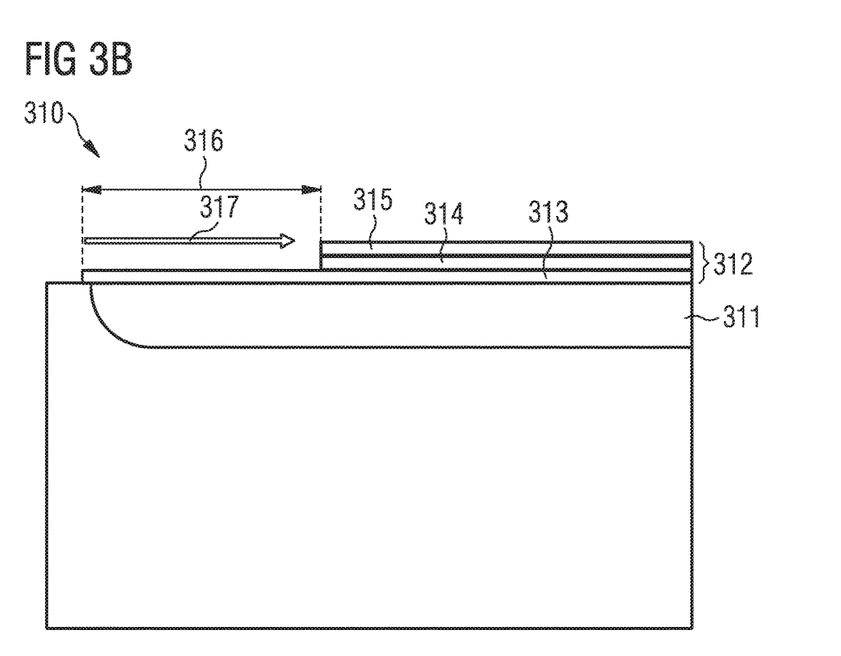

FIGS. 3A and 3B show a comparison of semiconductor chips processed according to prior art and according to an exemplary embodiment, respectively. In particular, FIG. 3A shows an edge of a semiconductor chip 300. The semiconductor chip 300 comprises a contact area or cell field 301, e.g. a gate or source contact, having arranged thereon a contact stack or metallization 302 comprising three layers 303, 304, and 305 comprising or made of titanium, nickel vanadium, and silver, respectively. As can be seen in FIG. 3A, the complete multilayer contact stack 302 extends over the complete contact area or cell field and slightly projects laterally over the same above a passivation or passivation layer forming the edge of the semiconductor chip.

Contrary to that, the semiconductor chip 310 shown in FIG. 3B is processed according to an exemplary embodiment. In particular, FIG. 3B shows an edge of the semiconductor chip 310. The semiconductor chip 310 comprises a contact area or cell field 311, e.g. a gate or source contact, having arranged thereon a contact stack or metallization 312 comprising three layers 313, 314, and 315 comprising or made of titanium, nickel vanadium, and silver, respectively. As can be seen in FIG. 3B, the complete multilayer contact stack 312 extends only over a central portion of the contact area 311 while at a boundary region 316 only the first layer 313 remains after a pull back process step.

That is, the first layer 313 extends laterally over the complete contact area 311 and above a passivation or passivation layer forming the edge of the semiconductor chip. It should be noted that the passivation layer at the edge may be formed by a portion of a semiconductor substrate (as shown in FIG. 3B) or by an additional passivation layer. The degree of pull back or the width of the additional removal of the second and third layers 314 and 315, respectively is indicated by arrow 317. The width (of such a boundary region) may be in the range of 10 micrometer to 300 micrometer. However, it may be different at different portions of one and the same semiconductor chip.

Thus, the edge of the semiconductor chip 310 is flatter or stepped or "more rounded" as the one shown in FIG. 3A possibly leading to reduced mechanical and/or thermal stress at the edge during repeated thermocycles.

Figure 4:
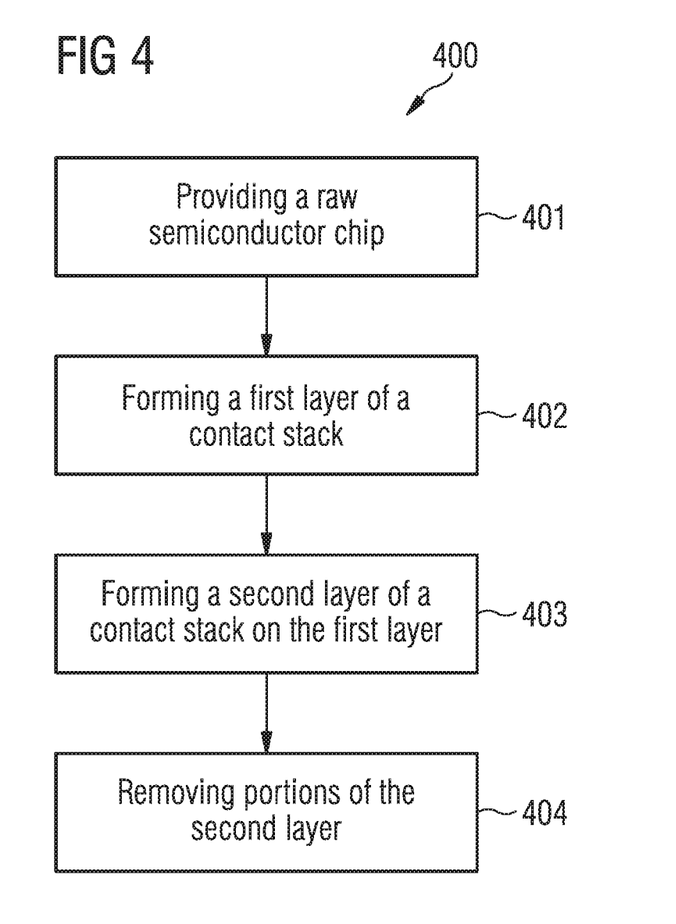
FIG. 4 shows a flowchart of a method of processing a semiconductor chip.

FIG. 4 shows a flowchart of a method of processing a semiconductor chip. In particular, the method 400 comprises providing a raw semiconductor chip comprising a frontside at which two contact areas are formed, wherein a passivation layer is arranged between the two contact areas (step 401). It should be noted that of course more than two contact areas and more than one passivation layer may be formed.

Subsequently, a first layer of a contact stack or metallization is formed on the frontside of the raw semiconductor chip (step 402). This first layer may be an adhesion promotion layer.

Afterwards, a second layer of a contact stack is formed on the first layer (step 403). The second layer may be a contact layer used for electrically contacting the contact area or metallization pad.

Subsequently, portions of the second layer are removed above the passivation layer and portions of the contact areas. Thus, the contact stack is structured in a way by only partially removing at least one layer of the contact stack in specific regions while maintaining at least one layer of the contact stack in the same regions (e.g. above portions of the passivation layer and a boundary region).

In case the first layer remaining (and being exposed) in the specific regions comprises or consists of a non-wettable material, e.g. oxidized titanium, central (solderable) portions of the contact areas or metallization pads are surrounded by a non-wettable element (the remaining first layer) which is formed or derived from the originally deposited contact stack or metallization. Thus, it may be possible to provide in an efficient way a protection against overflow or creeping of solder during a subsequent soldering process reducing the chances of shorts between contact areas or metallization pads on the frontside of a semiconductor chip or front- and backside at edge portions of the semiconductor chips.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor chip comprising:
    a first contact area and a second contact area both formed at a frontside of the semiconductor chip;
    a passivation layer arranged at the frontside between the first contact area and the second contact area; and
    a contact stack formed at the frontside of the semiconductor chip and comprising a plurality of layers,
    wherein the plurality of layers comprises an adhesion promoter layer, a contact layer and a planar protection layer, wherein the contact layer is arranged between the adhesion promoter layer and the protection layer,
    wherein the contact layer and the planar protection layer of the plurality of layers are removed from the passivation layer and boundary regions of the contact areas being adjacent to the passivation layer; and
    wherein only the adhesion promoter layer of the contact stack is present in the boundary region of the contact areas adjoining the passivation layer,
    wherein gaps are located directly in between sidewalls of the adhesion promoter layer and adjacent sidewalls of the layer next to the adhesion promoter layer of the contact stack, and further the gaps are interposed between the two sidewalls of the passivation layer over the first contact area or the second contact area.

2. The semiconductor chip according to claim 1, wherein at least one layer of the plurality of different layers is present in the boundary region of the passivation layer adjoining the contact areas.

3. The semiconductor chip according to claim 1, wherein the plurality of different layers is formed by at least three layers each comprising a different metallic material.

4. The semiconductor chip according to claim 1, wherein at least one layer of the plurality of layers comprises one element selected out of the group consisting of: titanium, tungsten, titanium nitride, nickel, vanadium, copper, silver, gold, and a compound thereof.

5. The semiconductor chip according to claim 1, wherein the first contact area may form a gate contact and the second contact area may form a source contact.

6. The semiconductor chip according to claim 1, wherein the semiconductor chip forms one element out of the group consisting of:

transistor; and
diode.

7. The semiconductor chip according to claim 1, wherein a width of the boundary regions is different in different contact areas of the frontside of the semiconductor chip.

8. The semiconductor chip according to claim 1, wherein a width of the boundary regions of the contact areas is in the range of 10 micrometer to 300micrometer.

9. The semiconductor chip according to claim 1, wherein the contact stack comprises an adhesion promoter layer comprising titanium.

10. The semiconductor chip according to claim 1, wherein the contact stack comprises a contact layer comprising at least one of the group consisting of nickel, vanadium, copper, and an alloy thereof.

11. The semiconductor chip according to claim 1, wherein the contact stack comprises a protection layer comprising at least one of the group consisting of silver and gold.

* * * * *